US011735255B2

(12) United States Patent
Villa et al.

(10) Patent No.: US 11,735,255 B2
(45) Date of Patent: *Aug. 22, 2023

(54) VOLTAGE EQUALIZATION FOR PILLARS OF A MEMORY ARRAY

(71) Applicant: Micron Technology, Inc., Boise, ID (US)

(72) Inventors: Corrado Villa, Sovico (IT); Ferdinando Bedeschi, Biassono (IT); Paolo Fantini, Vimercate (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/880,804

(22) Filed: Aug. 4, 2022

(65) Prior Publication Data

US 2022/0392527 A1  Dec. 8, 2022

Related U.S. Application Data

(63) Continuation of application No. 17/116,893, filed on Dec. 9, 2020, now Pat. No. 11,437,097.

(51) Int. Cl.
G11C 13/00 (2006.01)
H10N 70/00 (2023.01)
H10N 70/20 (2023.01)

(52) U.S. Cl.
CPC ......... G11C 13/0026 (2013.01); G11C 13/00 (2013.01); G11C 13/003 (2013.01);
(Continued)

(58) Field of Classification Search
CPC ............ G11C 13/0026; G11C 13/0004; G11C 13/003; H01L 45/06; H01L 45/141; H01L 45/1683
(Continued)

(56) References Cited

U.S. PATENT DOCUMENTS 5,500,824 A  3/1996 Fink
8,437,184 B1 * 5/2013 Hsiung ............... H10B 12/482
365/185.26
(Continued)

FOREIGN PATENT DOCUMENTS

TW   201432693 A   8/2014
TW   I690054 B   4/2020
WO   2019/160593 A1   8/2019

OTHER PUBLICATIONS

"International Search Report and Written Opinion of the International Searching Authority," issued in connection with Int'l Appl. No. PCT/US21/72632, dated Mar. 25, 2022 (10 pages).
(Continued)

*Primary Examiner* — Michael T Tran
(74) *Attorney, Agent, or Firm* — Holland & Hart LLP

(57) ABSTRACT

Methods, systems, and devices for voltage equalization for pillars of a memory array are described. In some examples, a memory array may be configured with conductive pillars that are each coupled with a respective set of memory cells, and may be selectively coupled with an access line. To support a dissipation or equalization of charge from unselected pillars, the memory array may be configured with a material layer or level that provides a dissipative coupling, such as a coupling having a relatively high resistance or a degree of capacitance, with a ground voltage or other voltage source (e.g., to support a passive equalization). Additionally, or alternatively, a memory array may be configured to support an active dissipation of accumulated charge or voltage by selectively coupling pillars that have been operated in a floating condition with a ground voltage or other voltage source (e.g., to perform a dynamic equalization).

20 Claims, 7 Drawing Sheets

(52) U.S. Cl.
CPC ....... *G11C 13/0004* (2013.01); *H10N 70/066* (2023.02); *H10N 70/231* (2023.02); *H10N 70/882* (2023.02)

(58) Field of Classification Search
USPC .............................................. 365/185.24, 163
See application file for complete search history.

(56) References Cited

U.S. PATENT DOCUMENTS

| | | | |
|---|---|---|---|
| 9,893,084 | B2 | 2/2018 | Rhie |
| 9,922,717 | B1* | 3/2018 | Maejima ............ G11C 16/3427 |
| 2001/0033515 | A1 | 10/2001 | Tanzawa |
| 2002/0024059 | A1 | 2/2002 | Hidaka |
| 2004/0000686 | A1 | 1/2004 | Houston |
| 2004/0169217 | A1 | 9/2004 | Houston |
| 2010/0200913 | A1 | 8/2010 | Masuoka et al. |
| 2010/0219483 | A1 | 9/2010 | Masuoka et al. |
| 2011/0147824 | A1 | 6/2011 | Son et al. |
| 2012/0003800 | A1* | 1/2012 | Lee ..................... H01L 29/7889 257/E21.645 |
| 2013/0105890 | A1* | 5/2013 | Hsiung ............... H01L 29/7827 257/331 |
| 2014/0198553 | A1 | 7/2014 | Lung |
| 2014/0226397 | A1 | 8/2014 | Ahn et al. |
| 2015/0115394 | A1 | 4/2015 | Pagaila et al. |
| 2016/0071586 | A1* | 3/2016 | Ogiwara ............ G11C 13/0069 365/163 |
| 2017/0271021 | A1* | 9/2017 | Futatsuyama .......... G11C 16/26 |
| 2018/0137922 | A1* | 5/2018 | Sakui ..................... H10B 41/41 |
| 2019/0067412 | A1 | 2/2019 | Tessariol et al. |
| 2019/0156897 | A1* | 5/2019 | Lee .................... G11C 16/0483 |
| 2019/0244933 | A1 | 8/2019 | Or-Bach et al. |
| 2019/0371818 | A1 | 12/2019 | Pekny |
| 2020/0144426 | A1* | 5/2020 | Kwon .................... H10B 43/27 |
| 2020/0212041 | A1 | 7/2020 | Machkaoutsan et al. |
| 2020/0227525 | A1 | 7/2020 | Ji et al. |
| 2020/0312876 | A1 | 10/2020 | Harari et al. |

OTHER PUBLICATIONS

Taiwanese Patent Office, "Office Action and Search Report", issued in connection with Taiwanese Patent Application No. 110145034 dated May 23, 2022 (6 pages).

* cited by examiner

SECTION A-A

■ +V (e.g., Selected Word Line)

▨ -V (e.g., Selected Sense Line, Unselected Pillar Line)

▩ 0V (e.g., Ground, Selected Pillar Line, Unselected Word Line)

□ Floating

■ Selected Memory Cell 105-a

▨ Unselected Memory Cell 105

VOLTAGE EQUALIZATION FOR PILLARS OF A MEMORY ARRAY

CROSS REFERENCE

The present application for patent is a continuation of U.S. patent application Ser. No. 17/116,893 by Villa et al., entitled "VOLTAGE EQUALIZATION FOR PILLARS OF A MEMORY ARRAY", filed Dec. 9, 2020, which is assigned to the assignee hereof, and which is expressly incorporated by reference in its entirety herein.

BACKGROUND

The following relates generally to one or more memory systems and more specifically to voltage equalization for pillars of a memory array.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

Figure 1:
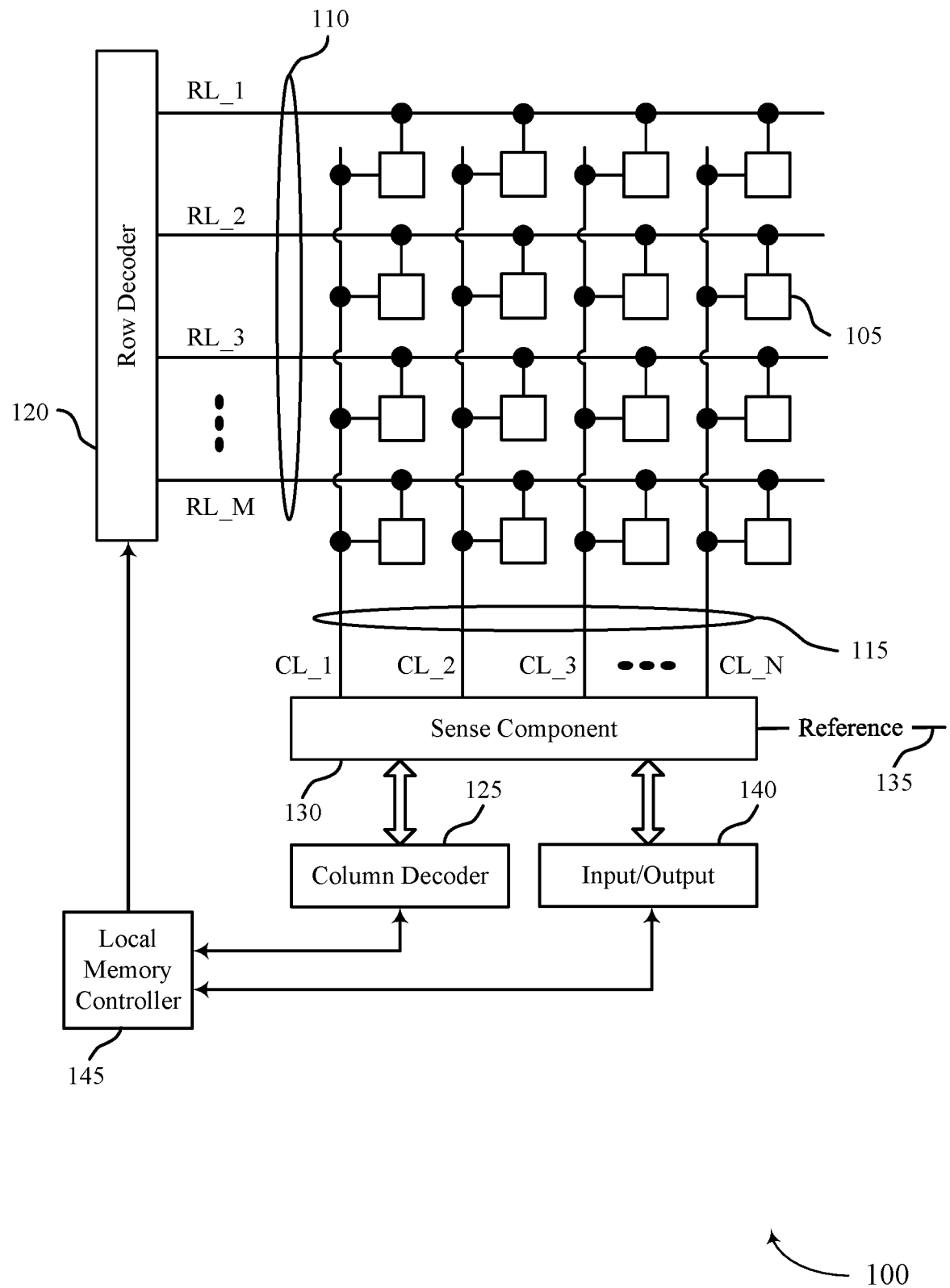
FIG. 1 illustrates an example of a memory array that supports voltage equalization for pillars of a memory array in accordance with examples as disclosed herein.

In some memory arrays, some structures may be electrically floating or floated during various operations of the memory array, which may refer to a condition where a structure is not or is not intended to be coupled with or connected with a voltage source or otherwise driven to a consistent or controlled voltage. For example, a structure of a memory device may be floated by selectively isolating the structure from a voltage source by way of a transistor or other switching component. However, floated structures of a memory array may have another coupling (e.g., an indirect coupling, a secondary coupling, a weak coupling), such as a capacitive coupling or a leakage coupling that permits a charge or voltage accumulation of the floated structure, and a voltage of the floated structure may thus be indeterminate. In some examples, an indeterminate voltage of floated structures may be associated with impaired performance of a memory array, for example, by accumulated voltage causing a disturbance in the state stored by a memory cell.

Some memory arrays may implement chalcogenide memory cells, which may be accessed or read by applying a read bias across a selected memory cell. In some examples, such as those that involve thresholding memory cells, a logic state (e.g., a logic 0 or a logic 1) of a memory cell may be determined based on whether a memory cell "thresholds" in the presence of a read bias, where thresholding may refer to a change in resistance state (e.g., a breakdown or collapse in resistance, an increase in current or charge transfer) as a result of applying a read bias or other bias. In some examples, unselected thresholding memory cells may be expected to provide a degree of electrical isolation between adjacent structures, or be otherwise associated with a relatively high resistance. However, unselected thresholding memory cells may be associated with a degree of capacitive or leakage coupling, which may allow a charge or voltage to accumulate on a floated memory array structure. In some cases, voltage of a floated structure may reach a level associated with an inadvertent selection or thresholding of one or more thresholding memory cells coupled with the floated structure.

In accordance with examples as disclosed herein, a memory array may be configured to support a dissipation or equalization of charge or voltage of structures that are floated during operation of a memory array. In some examples, a memory array may be configured with conductive pillars that are each coupled with a respective set of memory cells, and may be selectively coupled with or isolated from an access line (e.g., a sense line). To support a dissipation or equalization of charge from unselected pillars, the memory array may be configured with a material layer or level that provides a dissipative coupling, such as a coupling having a relatively high resistance or a degree of capacitance (e.g., a resistive and capacitive impedance), with a ground voltage or other voltage source (e.g., to support a passive equalization). Additionally, or alternatively, a memory array may be configured to support an active dissipation of accumulated charge or voltage by selectively coupling pillars that have been operated in a floating condition with a ground voltage or other voltage source (e.g., to perform a dynamic equalization). By implementing techniques in accordance with examples as disclosed herein, a memory array may limit a range of voltage or charge levels of structures that are floated during operation of the memory array compared with other techniques, which may improve operation of the memory array such as improving read margins, improving data retention, or improving other aspects of memory array reliability, among other benefits.

Features of the disclosure are initially described in the context of memory dies and related structures as described with reference to FIGS. 1-3. These and other features of the disclosure are further illustrated by and described with reference to an apparatus diagram and flowcharts that relate to voltage equalization for pillars of a memory array as described with references to FIGS. 4-6.

FIG. 1 illustrates an example of a memory array 100 that supports voltage equalization for pillars of a memory array in accordance with examples as disclosed herein. In some examples, the memory array 100 may be referred to as a memory chip, a memory device, or an electronic memory apparatus. The memory array 100 may be operable to provide physical memory addresses/space that may be used or referenced by a system (e.g., a host device coupled with the memory array 100 or coupled with a memory device that includes one or more memory arrays or dies).

The memory array 100 may include one or more memory cells 105 that may each be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11). In some examples, the memory cells 105 may be arranged in an array.

A memory cell 105 may store a logic state using a configurable material, which may be referred to as a memory element, a storage element, a memory storage element, a material element, a material memory element, a material portion, or a polarity-written material portion, among others. A configurable material of a memory cell 105 may refer to a chalcogenide-based storage component. For example, a chalcogenide storage element may be used in a phase change memory cell, a thresholding memory cell, or a self-selecting memory cell.

In some examples, the material of a memory cell 105 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (CO, or fluorine (F), each in atomic or molecular forms.

In some examples, a memory cell 105 may be an example of a phase change memory cell. In such examples, the material used in the memory cell 105 may be based on an alloy (such as the alloys listed above) and may be operated so as to undergo a phase change or change to different physical state during normal operation of the memory cell 105. For example, a phase change memory cell 105 may have an amorphous state (e.g., a relatively disordered atomic configuration) and a crystalline state (e.g., a relatively ordered atomic configuration).

In some examples, such as for thresholding memory cells 105 or self-selecting memory cells 105, some or all of the set of logic states supported by the memory cells 105 may be associated with an amorphous state of a chalcogenide material (e.g., the material in a single state may be operable to store different logic states). In some examples, the storage element of a memory cell 105 may be an example of a self-selecting storage element. In such examples, the material used in the memory cell 105 may be based on an alloy (such as the alloys listed above) and may be operated so as to undergo a change to different physical state during normal operation of the memory cell 105. For example, a self-selecting memory cell may have a high threshold voltage state and a low threshold voltage state. A high threshold voltage state may correspond to a first logic state (e.g., a RESET state) and a low threshold voltage state may correspond to a second logic state (e.g., a SET state).

During a programming operation (e.g., a write operation) of a self-selecting memory cell 105, a polarity used for a write operation may influence (e.g., determine, set, program) a particular behavior or characteristic of the material of the memory cell 105, such as the threshold voltage of the material. The difference in threshold voltages of the material of the memory cell 105 depending on the logic state stored by the material of the memory cell 105 (e.g., the difference between the threshold voltage when the material is storing a logic state '0' versus a logic state '1') may correspond to the read window of the memory cell 105.

The memory array 100 may include access lines (e.g., row lines 110 and column lines 115) arranged in a pattern, such as a grid-like pattern. Access lines may be formed of one or more conductive materials. In some examples, row lines 110, or some portion thereof, may be referred to as word lines. In some examples, column lines 115, or some portion thereof, may be referred to as digit lines or bit lines. References to access lines, row lines, column lines, word lines, digit lines, or bit lines, or their analogues, are interchangeable without loss of understanding or operation. Memory cells 105 may be positioned at intersections of the row lines 110 and the column lines 115.

Operations such as reading and writing may be performed on the memory cells 105 by activating or selecting access lines such as one or more of a row line 110 or a column line 115. By biasing a row line 110 and a column line 115 (e.g., applying a voltage to the row line 110 or the column line 115), a single memory cell 105 may be accessed at their intersection. The intersection of a row line 110 and a column line 115 in either a two-dimensional or three-dimensional configuration may be referred to as an address of a memory cell 105. An access line may be a conductive line coupled with a memory cell 105 and may be used to perform access operations on the memory cell 105. In some examples, the memory array 100 may perform operations responsive to commands, which may be issued by a host device or may be generated by a memory device that includes the memory array 100.

Accessing the memory cells 105 may be controlled through a row decoder 120 or a column decoder 125. For example, a row decoder 120 may receive a row address from the local memory controller 160 and activate a row line 110 based on the received row address. A column decoder 125 may receive a column address from the local memory controller 160 and may activate a column line 115 based on the received column address.

The sense component 130 may be operable to detect a state (e.g., a material state, a resistance, a threshold state) of a memory cell 105 and determine a logic state of the memory cell 105 based on the stored state. The sense component 130 may include one or more sense amplifiers to amplify or otherwise convert a signal resulting from accessing the memory cell 105. The sense component 130 may compare a signal detected from the memory cell 105 to a reference 135 (e.g., a reference voltage). The detected logic state of the memory cell 105 may be provided as an output of the sense component 130 (e.g., to an input/output 140), and may indicate the detected logic state to another component of a memory device that includes the memory array 100.

The local memory controller 160 may control the accessing of memory cells 105 through the various components (e.g., row decoder 120, column decoder 125, sense component 130). In some examples, one or more of the row decoder 120, column decoder 125, and sense component 130 may be co-located with the local memory controller 160. The local memory controller 160 may be operable to receive one or more of commands or data from one or more different memory controllers (e.g., an external memory controller associated with a host device, another controller associated with the memory array 100), translate the commands or the data (or both) into information that can be used by the memory array 100, perform one or more operations on the memory array 100, and communicate data from the memory array 100 to a host device based on performing the one or more operations. The local memory controller 160 may generate row signals and column address signals to activate the target row line 110 and the target column line 115. The local memory controller 160 may also generate and control various voltages or currents used during the operation of the memory array 100. In general, the amplitude, the shape, or the duration of an applied voltage or current discussed herein may be varied and may be different for the various operations discussed in operating the memory array 100.

The local memory controller 160 may be operable to perform one or more access operations on one or more memory cells 105 of the memory array 100. Examples of access operations may include a write operation, a read operation, a refresh operation, a precharge operation, or an activate operation, among others. In some examples, access operations may be performed by or otherwise coordinated by the local memory controller 160 in response to various access commands (e.g., from a host device). The local memory controller 160 may be operable to perform other access operations not listed here or other operations related to the operating of the memory array 100 that are not directly related to accessing the memory cells 105.

In some examples, some structures of the memory array 100 may be electrically floated during various access operations, which may refer to a condition where a structure is not or is not intended to be coupled with or connected with a voltage source or otherwise driven to a consistent or controlled voltage. For example, a structure of one or more row lines 110, or of one or more column lines 115, or some portion thereof or combination thereof, may be floated by selectively isolating the structure from a voltage source by way of a transistor or other switching component. However, floated structures of the memory array 100 may have another coupling (e.g., an indirect coupling, a secondary coupling, a weak coupling), such as a capacitive coupling or a leakage coupling that permits a charge or voltage accumulation of the floated structure, and a voltage of the floated structure may thus be indeterminate. In some examples, an indeterminate voltage of floated structures may be associated with impaired performance of the memory array 100.

In accordance with examples as disclosed herein, the memory array 100 may be configured to support a dissipation or equalization of charge or voltage of structures that are floated during various operations of the memory array 100. In some examples, an array of the memory array 100 may be configured with conductive pillars that are each coupled with a respective set of memory cells 105, and may be selectively coupled with or isolated from an access line (e.g., a row line 110 or portion thereof, a column line 115 or portion thereof). To support a dissipation or equalization of charge from unselected pillars, the array may be configured with a material layer or level that provides a dissipative coupling, such as a coupling having a relatively high resistance or a degree of capacitance (e.g., a resistive and capacitive impedance), with a ground voltage or other voltage source (e.g., to support a passive equalization). Additionally, or alternatively, the memory array 100 may be configured to support an active dissipation of accumulated charge or voltage by selectively coupling pillars that have been operated in a floating condition with a ground voltage or other voltage source (e.g., to perform a dynamic equalization). By implementing techniques in accordance with examples as disclosed herein, a range of voltage or charge levels of structures that are floated during operation of the memory array 100 may be relatively limited or reduced compared with other techniques, which may improve operation of the memory array 100. For example, such dissipation or equalization techniques may support improving read margins, improving data retention, or improving other aspects of reliability, among other benefits.

Figure 2A:
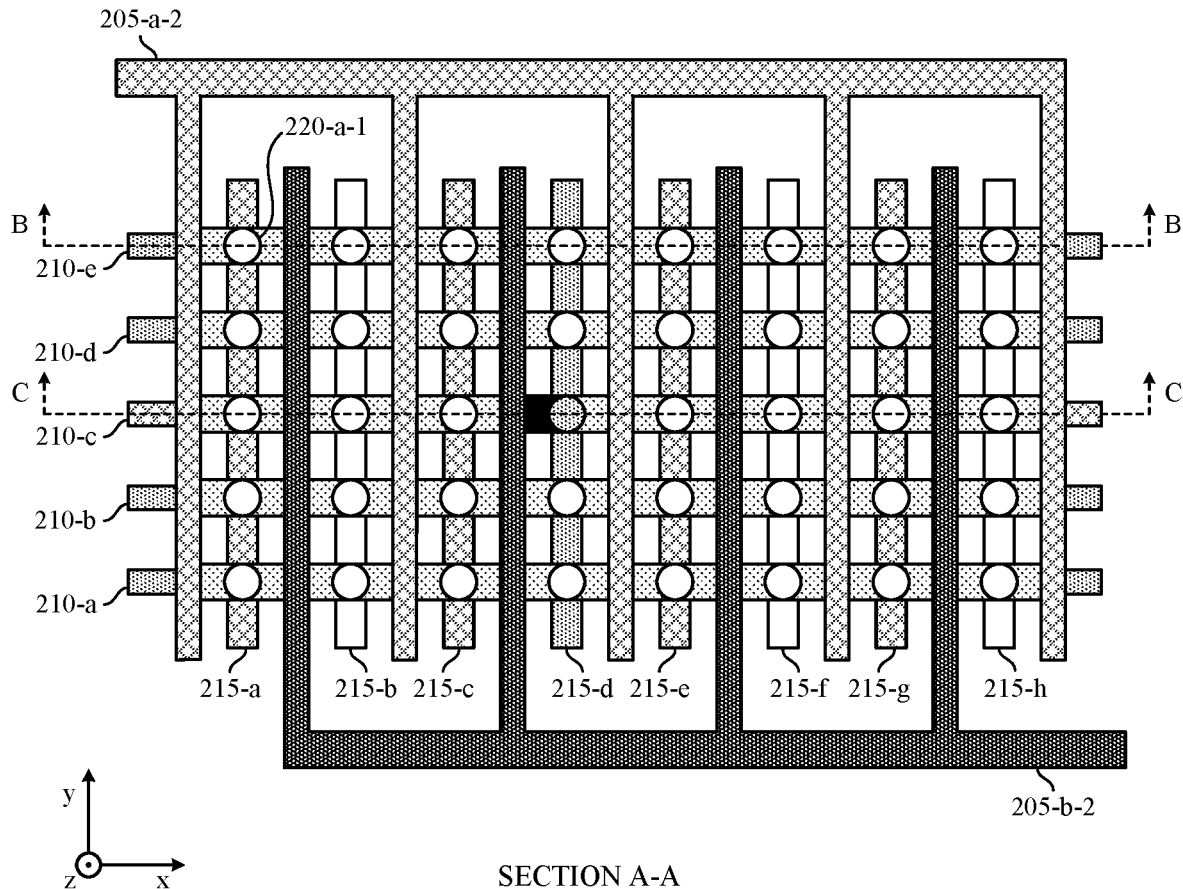
FIGS. 2A through 2C illustrates an example of a memory array that supports voltage equalization for pillars of a memory array in accordance with examples as disclosed herein.
Figure 2B:
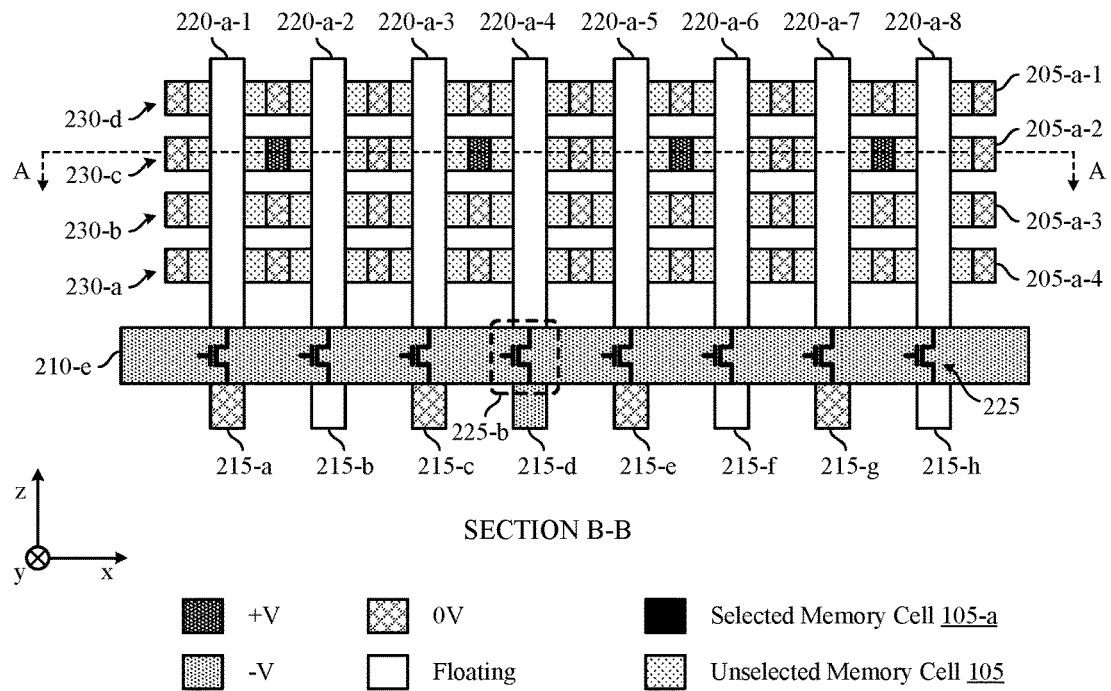
Figure 2C:
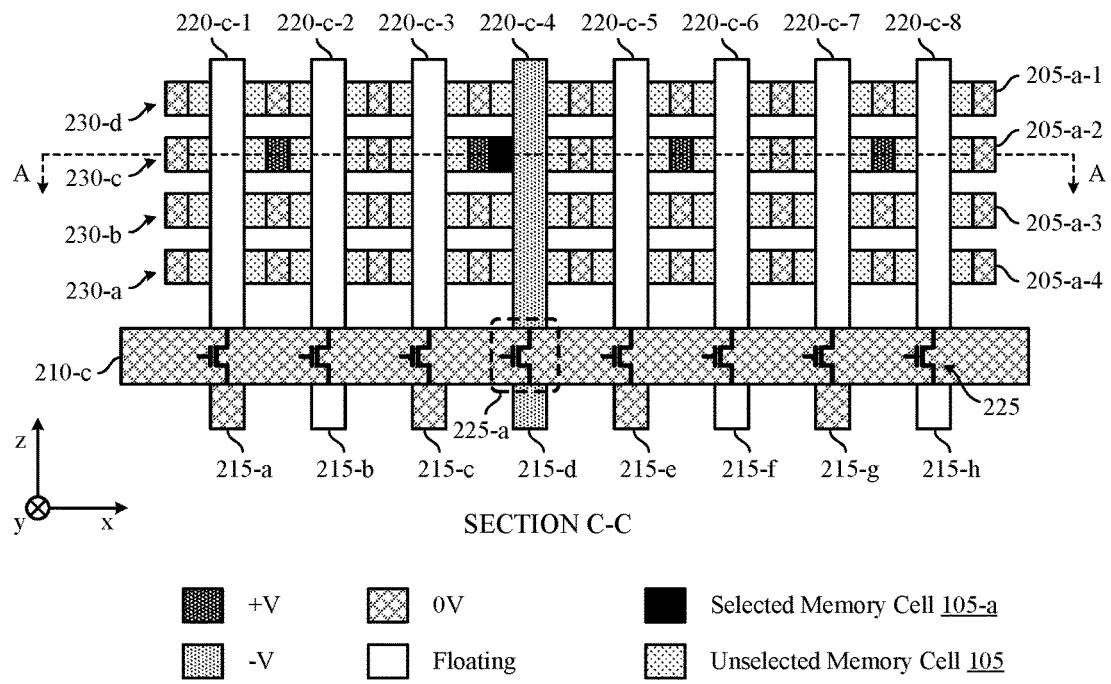

FIGS. 2A through 2C illustrates an example of a memory array 200 that supports voltage equalization for pillars of a memory array in accordance with examples as disclosed herein. The memory array 200 may be included in a memory array 100, and illustrates an example of a three dimensional arrangement of memory cells 105 that may be accessed by various access lines. FIG. 2A illustrates a top section view (e.g., SECTION A-A) of the memory array 200 relative to a cut plane A-A as shown in FIGS. 2B and 2C. FIG. 2B illustrates a side section view (e.g., SECTION B-B) of the memory array 200 relative to a cut plane B-B as shown in FIG. 2A. FIG. 2C illustrates a side section view (e.g., SECTION C-C) of the memory array 200 relative to a cut plane C-C as shown in FIG. 2A. The section views may be examples of cross-sectional views of the memory array with aspects removed for clarity. Elements of the memory array 200 may be described relative to an x-direction, a y-direction, and a z-direction, as illustrated in each of FIGS. 2A through 2C. Although some elements included in FIG. 2A, 2B, or 2C are labeled with a numeric indicator, other corresponding elements are not labeled, although they are the same or would be understood to be similar, in an effort to increase visibility and clarity of the depicted features. Further, although some quantities of repeated elements are shown in the illustrative example of memory array 200, techniques in accordance with examples as described herein may be applicable to any quantity of such elements, or ratios of quantities between one repeated element and another.

In the example of memory array 200, memory cells 105 and word lines 205 may be distributed along the z-direction according to decks 230 (e.g., as illustrated in FIGS. 2B and 2C), and the z-direction may be orthogonal to a substrate (not shown) of the memory array 200. Although the illustrative example of memory array 200 includes four decks 230, a memory array 200 in accordance with examples as disclosed herein may include 64 decks 230, 128 decks 230, or any other quantity of decks 230. Word lines 205 may be arranged in a comb structure, with projections extending along the y-direction through alternating gaps between pillars 220 (e.g., with two word lines 205 per deck 230, according to odd word lines 205-*a* and even word lines 205-*b*). Each memory cell 105 may be addressed or accessed according to an intersection between a word line 205 and a pillar 220 (e.g., a conductive pillar extending along the z-direction, which may be orthogonal to the y-direction). For example, as illustrated, a selected memory cell 105-*a* of the deck 230-c may be located between or accessed according to an intersection between the pillar 220-c-4 and the word line 205-b-2.

The memory cells 105 may each include a chalcogenide material and, in some examples, may be or include thresholding memory cells or thresholding chalcogenide storage elements. A memory cell 105 may be read by applying a read bias across the memory cell 105, and a logic state of the memory cell 105 may be determined based on whether the memory cell 105 thresholds in the presence of an applied read bias. In the example of memory array 200, a memory cell 105 may be read with a voltage having a magnitude of 2*V (e.g., as a voltage or bias applied across the memory cell 105), and such a voltage may cause a memory cell 105 storing a first logic state (e.g., a logic 0) to threshold, and may not cause a memory cell 105 storing a second logic state (e.g., a logic 1) to threshold. In the example of memory array 200, a read bias may be applied by biasing a selected word line 205 with a positive voltage (e.g., +V) and by biasing a selected pillar 220 with a negative voltage (e.g., −V). Regarding the selected memory cell 105-a, a read bias, +V, may be applied to the word line 205-b-2, while other unselected word lines may be grounded (e.g., biased to 0V). In some examples, a word line 205, or some portion thereof, may be an example of a row line 110 described with reference to FIG. 1, and selection or biasing of word lines 205 may be performed by or supported by a row decoder 120.

To apply a corresponding read bias to a pillar 220, the pillars 220 may be configured to be selectively coupled with a sense line 215 (e.g., an access line extending along the y-direction) via a respective transistor 225 (e.g., a thin film transistor). Accordingly, a selected pillar 220, or a combination of a selected pillar 220 and a selected sense line 215, may be an example of a selected column line 115 described with reference to FIG. 1 (e.g., a bit line). The transistors 225 may be activated by a pillar line 210 (e.g., extending along the x-direction, which may be orthogonal to the y-direction or z-direction) coupled with a gate of the transistors 225. In other words, each of the pillars 220 may have a first end (e.g., towards the negative z-direction, a bottom end) configured for coupling (e.g., to be selectively coupled with) a sense line 215 (e.g., an access line). In some examples, the pillar lines 210 and the transistors 225 may be considered to be components of a column decoder 125 (e.g., as pillar decoder components). The selection or biasing of pillars 220, sense lines 215, or pillar lines 210, or various combinations thereof, may be performed by or supported by a column decoder 125, a sense component 130, or both.

To apply the read bias, −V, to the pillar 220-c-4, the sense line 215-d may be biased with the read bias, −V, and the pillar line 210-c may be grounded (e.g., biased to 0V) or biased to some other voltage that is relatively higher than the read bias, −V. In an example where the transistors 225 are n-type transistors, the pillar line 210-c being biased with a voltage that is relatively higher than the sense line 215-d may activate the transistor 225-a (e.g., cause the transistor 225-a to operate in a conducting state), thereby coupling the pillar 220-c-4 with the sense line 215-d and biasing the pillar 220-c-4 with the associated read voltage, −V. Other pillars 220 of the memory array 200 may be electrically floating when the transistor 225-a is activated. For example, the ground voltage being applied to the pillar line 210-c may not activate other transistors coupled with the pillar line 210-c, because the ground voltage of the pillar line 210-c may not be greater than the voltage of the other sense lines 215 (e.g., which may be biased with a ground voltage or may be floating). Further, other unselected pillar lines 210, including pillar line 210-e as shown in FIG. 2B, may be biased with the negative voltage (e.g., −V, or some other negative bias or bias relatively near or below the negative read voltage), such that none of the transistors 225 along an unselected pillar line 210 are activated. Thus, even the transistor 225-b coupled with the pillar line 210-e may be deactivated (e.g., operating in a non-conductive state), thereby selectively isolating the negative voltage of the sense line 215-d from the pillar 220-a-4, among other pillars 220.

In some examples, floating pillars 220 may be charged due to leakage, capacitive coupling (e.g., with word lines 205), or other causes. For example, an activation or biasing of the selected word line 205-b-2 may cause a voltage of unselected pillars 220 (e.g., other than the pillar 220-c-4) to drift due to charge leakage through unselected memory cells 105, or due to a capacitive coupling supported between the word line 205-b-2 and floating pillars 220 through the unselected memory cells 105, among other causes. In some examples, such disturbance of floating pillars 220 may accumulate over time, or over successive activations of one or more word lines 205. A drift of voltage of unselected pillars 220 may cause a voltage level across unselected memory cells 105 to change (e.g., rise) which, in some examples, may cause inadvertent thresholding of unselected memory cells 105. Such effects may be associated with a reduction of read margins when reading selected memory cells 105, or a disturbance to stored logic states of memory cells 105, or other degraded performance of the memory array 200. Thus, in accordance with examples as disclosed herein, the memory array 200 may be configured with various techniques for managing charge or voltage of unselected pillars 220.

Figure 3:
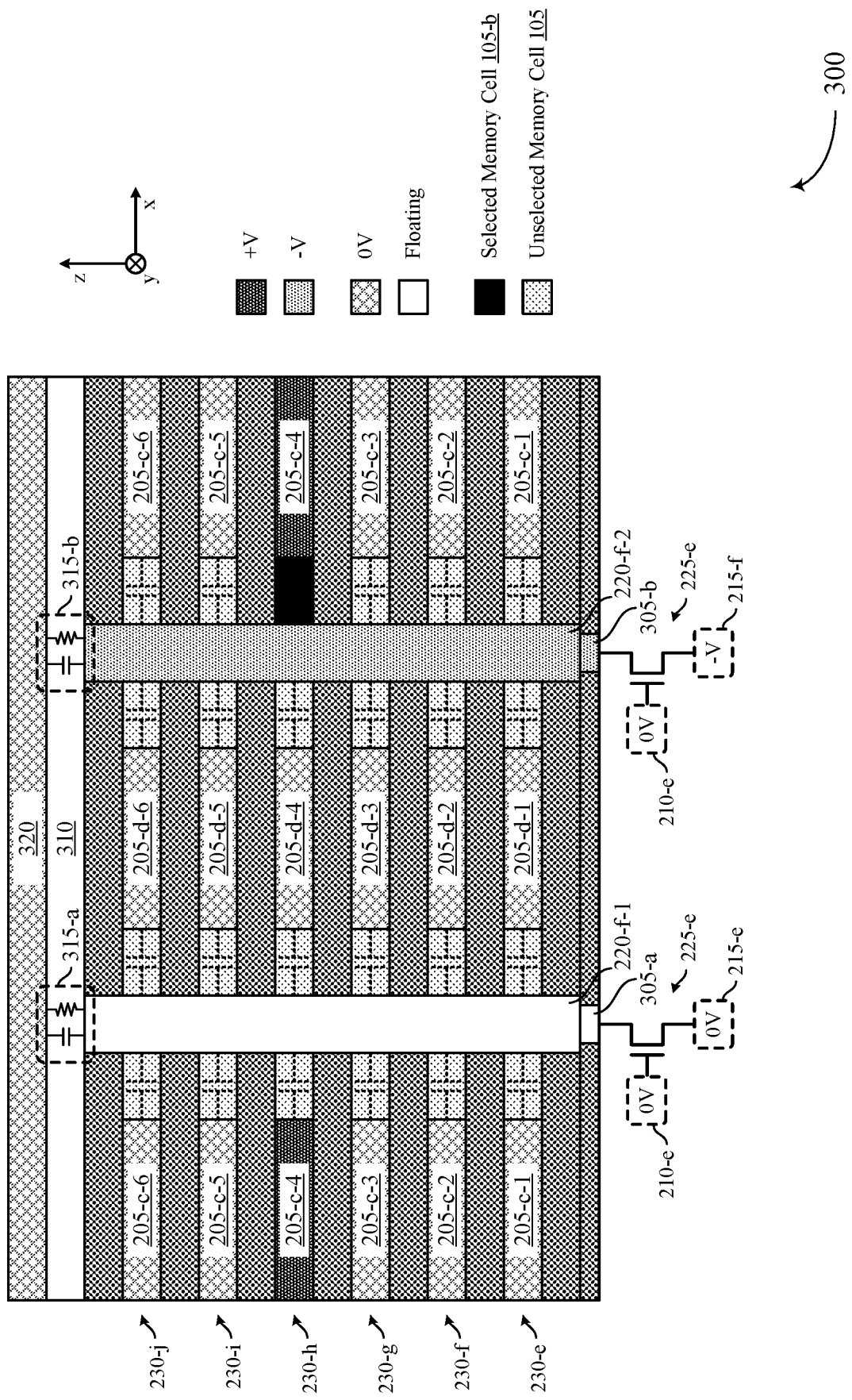
FIG. 3 illustrates an example of a memory array that supports voltage equalization for pillars of a memory array in accordance with examples as disclosed herein.

FIG. 3 illustrates an example of a memory array 300 that supports voltage equalization for pillars of a memory array in accordance with examples as disclosed herein. The memory array 300 may be an example of aspects of a memory array 200 described with reference to FIG. 3, including an arrangement of word lines 205 (e.g., odd word lines 205-c and even word lines 205-d), pillars 220 (e.g., an unselected pillar 2204-1 and a selected pillar 220-f-2), and memory cells 105 (e.g., a selected memory cell 105-b and unselected memory cells 105). The pillar 2204-1 may have a first end configured for coupling with (e.g., a first end configured to be selectively coupled with) a sense line 215-e via a transistor 225-e, which may be activated by a pillar line 210-e. The pillar 220-f-2 may have a first end configured for coupling with a sense line 215-f via a transistor 225-f, which may also be activated by the pillar line 210-e. Each of the transistors 225 may be coupled with the respective pillar 220 via a respective electrode 305 (e.g., a contact, an electrical contact), such as electrode 305-a and 305-b, which may be an electrical contact formed for the purpose of electrically coupling the respective components. Aspects of the memory array 300 may be described with reference to an x-direction, a y-direction, and a z-direction, and some elements of the memory array 300 may be arranged according to decks 230 (e.g., distributed along the z-direction). In some cases, FIG. 3 illustrates a side section view (e.g., SECTION B-B) of the memory array 200 relative to a cut plane B-B as shown in FIG. 2A.

The pillar 2204-1 may be electrically floated when the memory cell 105-b is selected (e.g., for a read operation, for a write operation, or for another type of access operation). The floating of the pillar 2204-1 may be based at least in part on a deactivation of the transistor 225-e, for example. In other examples, the floating of a pillar 220 may be based at least in part on a deactivation of the corresponding transistor 225, a floating of the corresponding sense line 215, or a combination thereof. The floated pillar 2204-1 may, however, be coupled with one or more other structures (e.g., via an indirect coupling, a secondary coupling, a weak coupling) that permit a charge or voltage accumulation of the floated pillar 2204-1. For example, the pillar 2204-1 may be coupled via one or more word lines 205 via one or more unselected memory cells 105, which may support a capacitive coupling (e.g., as illustrated), a charge leakage coupling, or other coupling that, in the absence of a dissipating structure or operation, may cause a voltage of the pillar 2204-1 to drift or be otherwise indeterminate. In one example, such a drift may be related to the activation of the word line 205-c-4 (e.g., an odd word line 205 having a comb configuration), and a coupling between the word line 205-c-4 and the pillar 2204-1 via an unselected memory cell 105 of the deck 230-h. In some cases, a voltage of the floated pillar 2204-1 may reach a level associated with an inadvertent selection or thresholding of one or more memory cells 105 that are in contact with the floated pillar 2204-1. Although described with reference to an electrically floated pillar 2204-1 adjacent to the selected pillar 220-f-2 (e.g., along the x-direction), the described phenomena and techniques may be applicable to other pillars 220 (not shown), including other unselected pillars along the x-direction (e.g., sharing a common pillar line 210-e with the selected pillar 220-f-2 and the unselected pillar 220-f-2 or along a different pillar line 210), or along the y-direction (e.g., sharing a common sense line 215 with the selected pillar 220-f-2 or the unselected pillar 2204-1 or along a different sense line 215).

In accordance with examples as disclosed herein, the memory array 300 may be configured to support a dissipation or equalization of charge or voltage of pillars 220 that are floated during operation of the memory array 200. By implementing such techniques, the memory array 300 may limit a range of voltage or charge levels of floated pillars 220, which may improve operation of the memory array 300 such as improving read margins, improving data retention, or improving other aspects of operational reliability, among other benefits.

In some examples that support the described techniques, the memory array 300 may be configured with a material layer or level that provides a dissipative coupling, such as a coupling having a relatively high resistance or a degree of capacitance (e.g., a resistive and capacitive impedance), with a ground voltage or other voltage source (e.g., to support a passive equalization). For example, the memory array 300 may include a first layer 310 adjacent to (e.g., in contact with, directly adjacent to) the pillars 220 (e.g., pillars 2204-1 and 220-f-2, and other pillars 220 of the memory array 300 along the x-direction or y-direction as described but not illustrated). In some examples, the first layer 310 may be an example of a highly resistive layer, and may be formed by an oxide material (e.g., a thin oxide material). The contact between the first layer 310 and the pillars 220 may be at respective ends of the pillars 220, along the z-direction, opposite from corresponding transistors 225 or electrodes 305.

The memory array 300 may also include a second layer 320 adjacent to (e.g., in contact with) the first layer 310 (e.g., in contact with the first layer 310 on a side opposite side from the side that is in contact with the pillars 220). In some examples, the second layer 320 may be a metal layer, such as a layer of tungsten, graphene, aluminum oxide, tin, titanium nitride, or some other material or combination thereof. The second layer 320 may be coupled or connected with a ground voltage source, or some other reference voltage source or equalization voltage source. The coupling of the second layer 320 with the ground or other voltage source may or may not include a selectable coupling (e.g., may or may not be a coupling via a switching component such as a transistor). The first layer 310 may be configured to support a dissipative coupling with the second layer 320, such as dissipating or equalizing a voltage difference between one or more pillars 220 and the second layer 320 (e.g., when pillars 220 are electrically floated or selectively isolated from a sense line 215).

In various examples, the first layer 310 may be configured for a resistive impedance between the pillars 220 and the second layer 320, for a capacitive impedance between the pillars 220 and the second layer 320, or for a combination of a resistive and capacitive impedance (e.g., a resistive-capacitance (RC) impedance) between the pillars 220 and the second layer 320. In some examples, such a configuration may be interpreted as a set of parallel impedances (e.g., RC distributed circuits) between the second layer 320 and the pillars 220. For example, the first layer 310 may be associated with a first impedance 315-a between the pillar 2204-1 and the second layer 320, a second impedance 315-b between the pillar 220-f-2, and so on.

In some examples, a resistance level of an impedance 315 may be configured with a relationship with a resistance level of the memory cells 105. For example, a resistance level of an impedance 315 may be higher than a resistance level of memory cells 105 (e.g., higher than a resistance level of a thresholded memory cell 105, higher than a resistance level of an unthresholded memory cell 105), such as a resistance of an impedance 315 being in a range of giga-ohms. In some examples, configuring the first layer 310 with a high resistance may limit the effect of dissipation on read operations. For example, leakage charge or current may be kept at some level below a charge transfer or current associated with detecting a logic state of a memory cell 105 (e.g., a dissipation current, for an assumed amount of voltage drift of an unselected pillar 220, may be configured to be approximately 5 nano-amps, which may be one or more orders of magnitude less than read current for detecting a state of the selected memory cell 105-b).

In some examples, the first layer 310 may be configured for a time constant of dissipating a voltage difference between a pillar 220 and the second layer 320 that is related to a duration of performing access operations of the memory array 300, depending on various objectives for balancing charge dynamics between dissipation operations and access operations. In some examples, an impedance 315 may be configured with a time constant being shorter than a duration for reading a memory cell 105, or being shorter than a duration for programming a memory cell 105, or both. For example, a programming operation may have a duration of approximately 50 nano-seconds, and a time constant of dissipation across the first layer 310 (e.g., via an impedance 315) may be on the order of tenths of nano-seconds (e.g., two orders of magnitude shorter than the programming operation). In some examples, such a configuration may be supported by a resistance of an impedance 315 being on the order of giga-ohms, and a capacitance of an impedance 315 being on the order of femto-farads. In some examples, such a configuration may support relatively rapid dissipation of leakage charge accumulation, and relatively low probability of inadvertently thresholding non-selected memory cells.

In some examples, an impedance 315 may be configured with a time constant being longer than a duration for reading a memory cell 105, or being longer than a duration for programming a memory cell 105, or both. For example, a programming operation may have a duration of approximately 50 nano-seconds, and a time constant of dissipation across the first layer 310 (e.g., via an impedance 315) may be greater than 50 nano-seconds (e.g., on the order of microseconds), or a time constant of dissipation may be longer than or otherwise related to a configured duration between successive read operations, a configured duration between successive write operations, a configured duration between a read operation and a subsequent write operation, or some other configured duration between access operations. In some examples, such a duration or rate of dissipation may be suitable for limiting or avoiding inadvertent thresholding of non-selected memory cells, and may have other favorable characteristics when compared to relatively faster dissipation. For example, a relatively higher impedance 315 associated with a time constant of dissipation being longer than access operations may support improved stability of biasing various structures of the memory array 300, or may support relatively lower power consumption, than configurations having a relatively lower impedance 315 associated with a relatively shorter time constant.

In some examples that support the described techniques, the memory array 300 may be configured to support an active dissipation of accumulated charge or voltage by selectively coupling pillars 220 that have been operated in a floating condition with a ground voltage or other voltage source (e.g., to perform a dynamic equalization, to perform a hard grounding). For example, based at least in part on performing one or more access operations (e.g., an access operation using the selected pillar 220-f-2), the memory array 300 may be operated by selectively coupling one or more pillars 220 (e.g., the unselected pillar 2204-1, one or more other unselected pillars not shown, the selected pillar 220-f-2) with a corresponding sense line 215 while the sense line 215 is grounded (e.g., coupled with a same or different voltage source as the second layer 320). In various examples, such a dynamic equalization may be performed after each access operation using a selected pillar 220, after each access operation of a type (e.g., after a read operation, after a write operation), after a configured quantity of access operations or type of access operation, after a configured duration, or according to some other periodic or event-initiated criteria.

When manufacturing the memory array 300, various layers may be deposited or etched in an order to create the memory array 300. A substrate may be formed through which electrodes 305 may be formed. Alternating layers of conductive material (e.g., the material that forms the word lines 205) and insulative material (e.g., the material between the word lines 205) are deposited to form a stack of materials. After the stack of materials is formed, a cavity associated with the pillar 220 may be etched through the stack of materials until the substrate is exposed. In some cases, an isotropic etching process may be used to remove conductive materials and thereby make a cavity to receive material to act as memory storage elements. After the cavity for the pillar and the cavities for the memory storage elements are formed, the material for the memory storage element (e.g., a chalcogenide material) may be deposited in the cavities. After the memory material is deposited, the cavity associated with the pillar 220 may be etched (again) to remove the memory material that is filling the cavity until the substrate is exposed. After the cavity for the pillar is etched, a conductive material may be deposited into the cavity to form the pillar 220, such that the pillar 220 contacts the electrode 305 and the memory storage materials. After forming the pillar, the first layer 310 may be deposited. After forming the first layer 310, the second layer 320 may be deposited.

Although some examples of the described techniques for charge dissipation are provided in the context of material pillars that may be floated during access operations, the described techniques may be applicable to other types of structures of a memory array, including other examples of access lines or subfeatures thereof. For example, a configured dissipation path in accordance with the described techniques may be advantageously provided for or implemented for any structure of a memory array that may be floated (e.g., selectively floated, intermittently floated), including those structures that are electrically connected to or coupled with memory cells (e.g., thresholding memory cells) or other structures that may be inadvertently thresholded or selected based on an accumulation of leakage charge. Moreover, although examples of leakage dissipation may be supported by a coupling or connection with a ground voltage source, the techniques described herein may be supported by a coupling or connection with other voltage sources that have a voltage level that is different than a ground voltage (e.g., for a dissipation of an accumulated charge, for a dissipation of an accumulated voltage difference).

Figure 4:
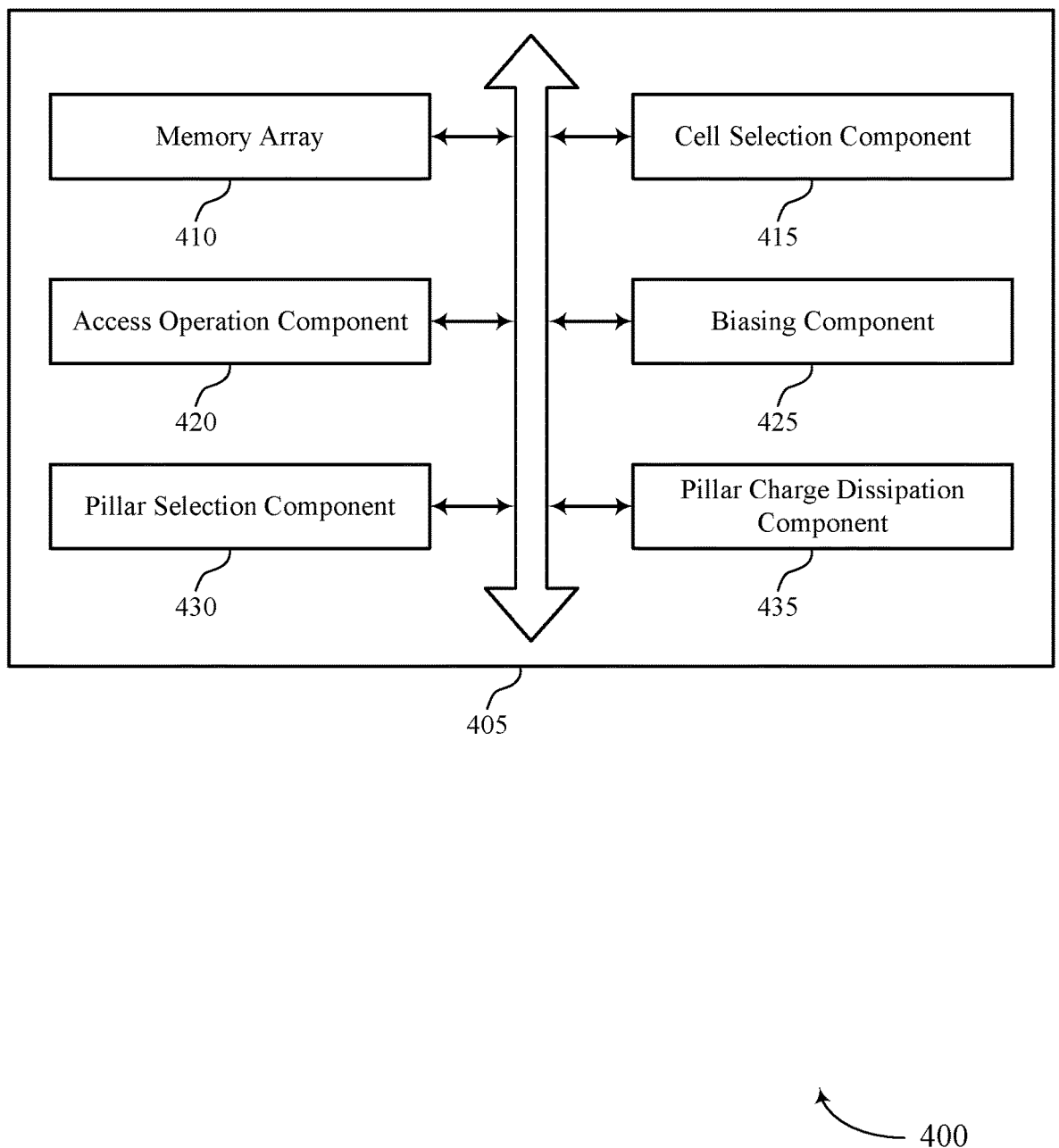
FIG. 4 shows a block diagram of a memory device that supports voltage equalization for pillars of a memory array in accordance with examples as disclosed herein.

FIG. 4 shows a block diagram 400 of a memory device 405 that supports voltage equalization for pillars of a memory array in accordance with examples as disclosed herein. The memory device 405 may be an example of aspects of a memory device or a memory array as described with reference to FIGS. 1 through 3. The memory device 405 may include a memory array 410 (e.g., including a set of memory cells), a cell selection component 415, an access operation component 420, a biasing component 425, a pillar selection component 430, and a pillar charge dissipation component 435. Each of these modules may communicate, directly or indirectly, with one another (e.g., via one or more buses).

The memory array 410 may include various arrangements of memory cells, including arrangements of memory cells 105 described with reference to FIGS. 1 through 3. The memory array 410 may include a plurality of memory cells configured to be selected for various access operations (e.g., read operations, write operations). In some cases, memory cells of the memory array 410 may each include a chalcogenide storage element, such as a thresholding chalcogenide storage element. In some examples, memory cells of the memory array 410 may be coupled between various access lines and conductive pillars of the memory array 410 (e.g., as described with reference to FIGS. 2A through 3).

The cell selection component 415 may select a memory cell (e.g., of the memory array 410) coupled between a first conductive pillar and a word line for an access operation. In some examples, the cell selection component 415 may select a second memory cell coupled between the second conductive pillar and a second word line for a second access operation. In various examples, the cell selection component 415 may select a memory cell based on an access command (e.g., as received from a host device), or based on an internal memory management operation (e.g., as determined by a component of the memory device 405, such as a device memory controller 155 or a local memory controller 165), or based on some other operation. In various examples, the cell selection component 415 may be a component of a device memory controller 155, or of a local memory controller 165, or may be otherwise in communication with such controllers.

The access operation component 420 may access a selected memory cell as part of an access operation based on biasing the word line with a first voltage (e.g., using the biasing component 425), on biasing an access line (e.g., a sense line) with a second voltage (e.g., using the biasing component 425), and on coupling the first conductive pillar with the access line (e.g., using the pillar selection component 430). In some examples, the access operation component 420 may access a second memory cell as part of a second access operation based on biasing the second word line with the first voltage, biasing the access line with the second voltage, and coupling the second conductive pillar with the access line. In various example, the access operation component 420 may be a component of a device memory controller 155, or of a local memory controller 165, or may be otherwise in communication with such controllers.

The pillar charge dissipation component 435 may dissipate a voltage difference between a conductive pillar and a ground node (e.g., based on accessing a memory cell). In some examples, the pillar charge dissipation component 435 may support the dissipating by transferring a charge via a layer in contact with one or more conductive pillars (e.g., the first conductive pillar, the second conductive pillar) of the memory array 410 (e.g., where the pillar charge dissipation component 435, or some portion thereof, includes such a layer). In some examples, the pillar selection component 430 may selectively isolate one or more conductive pillars (e.g., the first conductive pillar, the second conductive pillar) from the access line during the accessing of a memory cell, and the pillar charge dissipation component 435 may support dissipating a voltage difference between a selectively isolated conductive pillar and a ground node based on or during the selective isolation.

In some examples, to support a dissipating by the pillar charge dissipation component 435 (e.g., in an active or selective dissipating), the biasing component 425 may couple the access line with the ground node, and the pillar selection component 430 may selectively couple the second conductive pillar with the access line while the access line is coupled with the ground node. Thus, in some examples, the pillar charge dissipation component 435 may include logic components coupled with the biasing component 425, the pillar selection component 430, or both. Accordingly, in some examples, at least a portion of the pillar charge dissipation component 435 may refer to a component of a device memory controller 155, or of a local memory controller 165, or may be otherwise in communication with such controllers.

Figure 5:
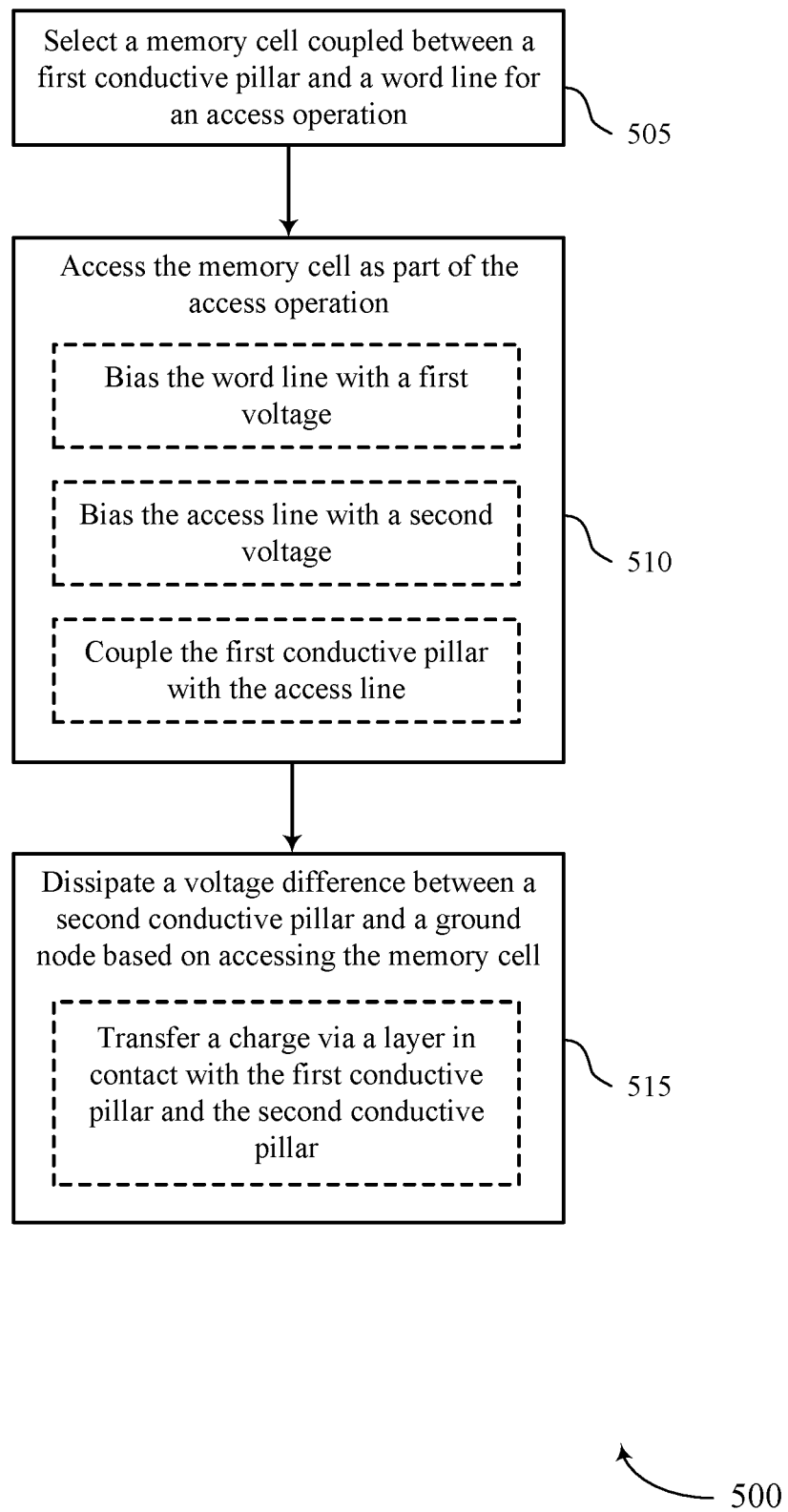
FIGS. 5 and 6 show flowcharts illustrating methods that support voltage equalization for pillars of a memory array in accordance with examples as disclosed herein.

FIG. 5 shows a flowchart illustrating a method or methods 500 that supports voltage equalization for pillars of a memory array in accordance with examples as disclosed herein. The operations of method 500 may be implemented by a memory device or its components as described herein (e.g., by a controller of a memory device, among other components). For example, the operations of method 500 may be performed by a memory device as described with reference to FIG. 4. Additionally, or alternatively, aspects of the method 500 may be implemented as instructions stored in memory (e.g., firmware stored in a memory coupled with or otherwise included in a memory device). For example, the instructions, when executed by a controller of the memory device, may cause the controller to perform the operations of the method 500. In some examples, a memory device may execute a set of instructions to control the functional elements of the memory device to perform the described functions. Additionally, or alternatively, a memory device may perform aspects of the described functions using special-purpose hardware.

At 505, the method 500 may include selecting a memory cell coupled between a first conductive pillar and a word line for an access operation. The operations of 505 may be performed according to the methods described herein. In some examples, aspects of the operations of 505 may be performed by a cell selection component as described with reference to FIG. 4.

At 510, the method 500 may include accessing the memory cell as part of the access operation. In various examples, the accessing may be based on one or more of: biasing the word line with a first voltage, biasing an access line (e.g., a sense line) with a second voltage, and coupling the first conductive pillar with the access line. The operations of 510 may be performed according to the methods described herein. In some examples, aspects of the operations of 510 may be performed by an access operation component as described with reference to FIG. 4.

At 515, the method 500 may include dissipating a voltage difference between a second conductive pillar and a ground node based on accessing the memory cell. In some examples, the dissipating may include transferring a charge via a layer in contact with the first conductive pillar and the second conductive pillar. The operations of 515 may be performed according to the methods described herein. In some examples, aspects of the operations of 515 may be performed by a pillar charge dissipation component as described with reference to FIG. 4.

In some examples, an apparatus as described herein may perform a method or methods, such as the method 500. The apparatus may include features, means, or instructions (e.g., a non-transitory computer-readable medium storing instructions executable by a processor) for selecting a memory cell coupled between a first conductive pillar and a word line for an access operation, accessing the memory cell as part of the access operation (e.g., based at least on part on one or more of: biasing the word line with a first voltage, biasing an access line (e.g., a sense line) with a second voltage, and coupling the first conductive pillar with the access line), and dissipating a voltage difference between a second conductive pillar and a ground node based on accessing the memory cell (e.g., including transferring a charge via a layer in contact with the first conductive pillar and the second conductive pillar).

Some examples of the method 500 and the apparatus described herein may further include operations, features, means, or instructions for selectively isolating the second conductive pillar from the access line during the accessing the memory cell, and dissipating the voltage difference between the second conductive pillar and the ground node may be based on selectively isolating the second conductive pillar from the access line.

Some examples of the method 500 and the apparatus described herein may further include operations, features, means, or instructions for selecting a second memory cell coupled between the second conductive pillar and a second word line for a second access operation, accessing the second memory cell as part of the second access operation based on biasing the second word line with the first voltage, biasing the access line with the second voltage, and coupling the second conductive pillar with the access line, and dissipating a voltage difference between the first conductive pillar and the ground node based on accessing the second memory cell, where the dissipating includes transferring a second charge via the layer.

In some examples of the method 500 and the apparatus described herein, dissipating the voltage difference between the second conductive pillar and the ground node may include operations, features, means, or instructions for coupling the access line with the ground node, and selectively coupling the second conductive pillar with the access line while the access line is coupled with the ground node.

Some examples of the method 500 and the apparatus described herein may further include operations, features, means, or instructions for selectively isolating a third conductive pillar from a second access line (e.g., a second sense line) during the accessing the memory cell, and dissipating a voltage difference between the third conductive pillar and the ground node based on accessing the memory cell, where the dissipating the voltage difference between the third conductive pillar and the ground node may include transferring a third charge via the layer that is in contact with the first conductive pillar, the second conductive pillar, and the third conductive pillar.

In some examples of the method 500 and the apparatus described herein, the memory cell includes a thresholding chalcogenide storage element.

Figure 6:
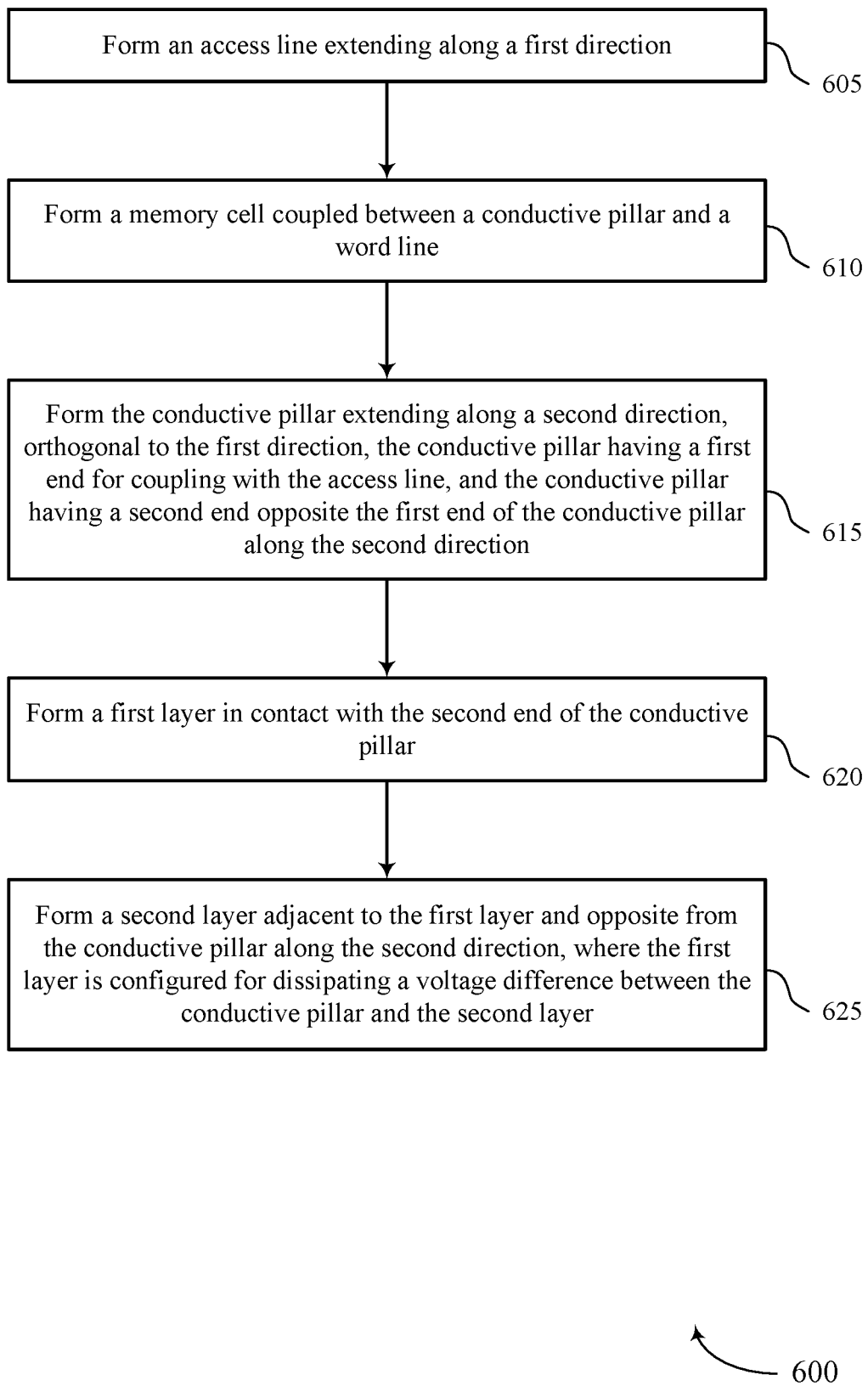

FIG. 6 shows a flowchart illustrating a method or methods 600 that supports voltage equalization for pillars of a memory array in accordance with examples as disclosed herein. The operations of method 600 may be implemented by a manufacturing system or one or more controllers associated with a manufacturing system. In some examples, one or more controllers may execute a set of instructions to control the functional elements of the manufacturing system to perform the described functions. Additionally, or alternatively, one or more controllers may perform aspects of the described functions using special-purpose hardware.

At 605, the method 600 may include forming an access line (e.g., a sense line) extending along a first direction. The operations of 605 may be performed according to the techniques described herein.

At 610, the method 600 may include forming a memory cell coupled between a conductive pillar and a word line. The operations of 610 may be performed according to the techniques described herein.

At 615, the method 600 may include forming the conductive pillar extending along a second direction, orthogonal to the first direction, the conductive pillar having a first end for coupling with the access line, and the conductive pillar having a second end opposite the first end of the conductive pillar along the second direction. The operations of 620 may be performed according to the techniques described herein.

At 620, the method 600 may include forming a first layer in contact with the second end of the conductive pillar. The operations of 630 may be performed according to the techniques described herein.

At 635, the method 600 may include forming a second layer adjacent to the first layer and opposite from the conductive pillar along the second direction, where the first layer is configured for dissipating a voltage difference between the conductive pillar and the second layer. The operations of 635 may be performed according to the techniques described herein.

In some examples, an apparatus as described herein may perform a method or methods, such as the method 600. The apparatus may include features, means, or instructions (e.g., a non-transitory computer-readable medium storing instructions executable by a processor) for forming an access line (e.g., a sense line) extending along a first direction, forming a memory cell coupled between a conductive pillar and a word line, forming the conductive pillar extending along a second direction, orthogonal to the first direction, the conductive pillar having a first end for coupling with the access line, and the conductive pillar having a second end opposite the first end of the conductive pillar along the second direction, forming a first layer in contact with the second end of the conductive pillar, and forming a second layer adjacent to the first layer and opposite from the conductive pillar, where the first layer is configured for dissipating a voltage difference between the conductive pillar and the second layer.

In some examples of the method 600 and the apparatus described herein, forming the memory cell may include operations, features, means, or instructions for forming an opening through an insulative material to expose a first dielectric layer, a conductive layer, and a second dielectric layer, and forming, in the opening, a chalcogenide component contacting the conductive layer, the first dielectric layer, and the second dielectric layer.

In some examples of the method 600 and the apparatus described herein, forming the conductive pillar may include operations, features, means, or instructions for depositing, into the opening, a conductive material to form the first conductive pillar in contact with the memory cell. In some examples, such depositing may be performed after or before a depositing of a barrier material.

Some examples of the method 600 and the apparatus described herein may further include operations, features, means, or instructions for depositing, into the opening, a barrier layer before depositing the conductive material to form the conductive pillar.

Some examples of the method 600 and the apparatus described herein may further include operations, features, means, or instructions for forming a contact extending through a substrate and coupled with a switching component, where the forming the opening through the insulative material exposes the contact.

In some examples of the method 600 and the apparatus described herein, the conductive pillar may be formed over the contact.

In some examples of the method 600 and the apparatus described herein, forming the second layer may include operations, features, means, or instructions for depositing a layer of a metal, tungsten, graphene, aluminum oxide, tin, titanium nitride, or a combination thereof, in contact with the first layer.

In some examples of the method 600 and the apparatus described herein, forming the first layer may include operations, features, means, or instructions for depositing a layer of an oxide in contact with the second end of the conductive pillar.

It should be noted that the methods described herein describe possible implementations, and that the operations and the steps may be rearranged or otherwise modified and that other implementations are possible. Furthermore, portions from two or more of the methods may be combined.

An apparatus is described. The apparatus may include an access line, a conductive pillar having a first end configured for coupling with the access line, the conductive pillar having a second end opposite the first end of the conductive pillar, and a memory cell coupled between the conductive pillar and a word line. The apparatus may also include a layer adjacent to the second end of the conductive pillar, where the layer is configured to support an equalization of voltage between the conductive pillar and a ground node.

Some examples of the apparatus may further include a second conductive pillar having a first end configured for coupling with the access line, the second conductive pillar having a second end opposite the first end of the second conductive pillar, and a second memory cell coupled between the second conductive pillar and a second word line. In some examples, the layer may be configured to support an equalization of voltage between the second conductive pillar and the ground node. In some examples, the second word line is the word line.

In some examples of the apparatus, the first end of the conductive pillar may be configured for a selective coupling with the access line via a switching component. In some examples, the layer may be configured to support an equalization of a voltage between the conductive pillar and the ground node while the conductive pillar is selectively isolated from the access line via the switching component.

In some examples of the apparatus, the first end of the conductive pillar may be electrically connected with the access line.

In some examples of the apparatus, the layer may be configured for a resistive and capacitive impedance between the ground node and the conductive pillar.

In some examples of the apparatus, the layer may be configured for a time constant of the equalization of voltage between the conductive pillar and the ground node being longer than a duration for programming the memory cell.

In some examples of the apparatus, the layer may be configured with a higher resistance than the memory cell.

In some examples of the apparatus, the memory cell may include a thresholding chalcogenide storage element.

Another apparatus is described. The apparatus may include an access line extending along a first direction, a conductive pillar extending along a second direction, orthogonal to the first direction, the conductive pillar having a first end configured to be selectively coupled with the access line via a switching component and a second end opposite the first end along the second direction, and a memory cell coupled between the conductive pillar and a word line. The apparatus may further include a first layer in contact with the second end of the conductive pillar, and a second layer in contact with a first side of the first layer opposite from a second side that is in contact with the conductive pillar, where the first layer may be configured for dissipating a voltage difference between the conductive pillar and the second layer.

Some examples of the apparatus may further include a second conductive pillar extending along the second direction, the second conductive pillar having a first end configured to be selectively coupled with the access line via a second switching component and a second end opposite the first end along the second direction, and a second memory cell coupled between the second conductive pillar and a second word line. In some examples, the first layer may be in contact with the second end of the second conductive pillar, and the first layer may be configured for dissipating a voltage difference between the second conductive pillar and the second layer.

In some examples of the apparatus, the first layer may be configured for a resistive and capacitive impedance between the second layer and the conductive pillar.

In some examples of the apparatus, the first layer may be configured for a time constant of dissipating the voltage difference between the conductive pillar and the second layer being longer than a duration for programming the memory cell.

In some examples of the apparatus, the second layer may be coupled with a ground voltage source.

In some examples of the apparatus, the first layer may be configured for dissipating the voltage difference between the conductive pillar and the second layer while the conductive pillar is selectively isolated from the access line via the switching component.

In some examples of the apparatus, the first layer may be configured with a higher resistance than the memory cell.

Some examples of the apparatus may further include a second access line extending along the first direction, a third conductive pillar extending along the second direction, the third conductive pillar having a first end configured to be selectively coupled with the second access line via a third switching component and a second end opposite the first end along the second direction, and a third memory cell coupled between the third conductive pillar and the word line. In some examples, the first layer may be in contact with the second end of the third conductive pillar, and the first layer may be configured for dissipating a voltage difference between the third conductive pillar and the second layer.

Some examples of the apparatus may further include a fourth memory cell coupled between the conductive pillar and a fourth word line, the fourth memory cell separated from the memory cell in the second direction, and the fourth word line separated from the word line in the second direction.

Some examples of the apparatus may further include a fifth memory cell coupled between the conductive pillar and a fifth word line, the fifth memory cell on an opposite side of the conductive pillar from the memory cell in a third direction that is orthogonal to the first direction and orthogonal to the second direction.

In some examples of the apparatus, the second layer may include a metal, tungsten, graphene, aluminum oxide, tin, titanium nitride, or a combination thereof, in contact with the first layer.

In some examples of the apparatus, the first layer may include an oxide layer in contact with the second end of the conductive pillar.

In some examples of the apparatus, the memory cell may include a thresholding chalcogenide storage element.

Another apparatus is described. The apparatus may include an access line, a first conductive pillar configured for coupling with the access line, a first memory cell coupled between the first conductive pillar and a first word line, a second conductive pillar configured for coupling with the access line, and a second memory cell coupled between the second conductive pillar and a second word line. The apparatus may further include a first layer in contact with the first conductive pillar and in contact with the second conductive pillar, and a second layer in contact with the first layer and opposite from the first conductive pillar and the second conductive pillar. The apparatus may further include a controller configured to cause the apparatus to select the first memory cell for an access operation, access the first memory cell as part of the access operation based at least in part on biasing the first word line with a first voltage and biasing the access line with a second voltage, and dissipate a voltage difference between the second conductive pillar and a ground node based at least in part on accessing the first memory cell. In some examples, dissipating the voltage difference between the second conductive pillar and the ground node may include transferring a charge between the second conductive pillar and the second layer via the first layer.

In some examples of the apparatus, the controller may be configured to cause the apparatus to select the second memory cell for a second access operation, access the second memory cell as part of the second access operation based at least in part on biasing the second word line with the first voltage and biasing the access line with the second voltage, and dissipate a voltage difference between the first conductive pillar and the ground node based at least in part on accessing the second memory cell. In some examples, dissipating the voltage difference between the first conductive pillar and the ground node may include transferring a second charge between the first conductive pillar and the second layer via the first layer.

In some examples of the apparatus, the controller may be configured to cause the apparatus to dissipate the voltage difference between the second conductive pillar and the ground node based at least in part on coupling the access line with the ground node and selectively coupling the second conductive pillar with the access line via a switching component while the access line is coupled with the ground node.

In some examples of the apparatus, the first memory cell and the second memory cell may include a thresholding chalcogenide storage element.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a plurality of conductive pillars over a substrate of a memory die;
a respective set of memory cells, of a plurality of memory cells, along each conductive pillar of the plurality of conductive pillars, each memory cell of the respective set of memory cells coupled with the conductive pillar and coupled with a respective access line of a plurality of access lines; and
a material in contact with the plurality of conductive pillars and configured to dissipate a voltage difference between each conductive pillar of the plurality of conductive pillars and a voltage source.

2. The apparatus of claim 1, further comprising:
a second material in contact with the material opposite the plurality of conductive pillars, wherein the second material is configured to couple with the voltage source.

3. The apparatus of claim 2, wherein the second material comprises a conductive material coupled with the voltage source.

4. The apparatus of claim 2, wherein the second material is configured to couple with the voltage source via a transistor.

5. The apparatus of claim 2, wherein the material comprises a first material layer in contact with the plurality of conductive pillars, and wherein the second material comprises a second material layer in contact with the first material layer.

6. The apparatus of claim 1, wherein each conductive pillar of the plurality of conductive pillars is configured to couple with a respective second access line.

7. The apparatus of claim 6, wherein each conductive pillar of the plurality of conductive pillars is configured to couple with the respective second access line via a respective transistor.

8. The apparatus of claim 6, wherein each conductive pillar of the plurality of conductive pillars is in contact with the material at a first end of the conductive pillar and is configured to couple with the respective second access line via a second end of the conductive pillar opposite the first end.

9. The apparatus of claim 1, wherein each access line of the plurality of access lines comprises a set of multiple conductive portions each extending along a direction over the substrate of the memory die, each conductive portion coupled with a respective subset of memory cells of the plurality of memory cells.

10. The apparatus of claim 1, wherein the voltage source is a ground voltage source.

11. The apparatus of claim 1, wherein the plurality of conductive pillars is formed through a stack of one or more material layers over the substrate.

12. The apparatus of claim 1, wherein the material comprises an oxide material.

13. The apparatus of claim 1, wherein each memory cell of the respective sets of memory cells comprises a chalcogenide storage element.

14. A method, comprising:

performing an access operation on a memory cell based at least in part on biasing a first pillar of a plurality of pillars, wherein the memory cell is coupled with the first pillar; and dissipating, after performing the access operation, a voltage difference between one or more pillars of the plurality of pillars and a voltage source based at least in part on a transfer of a charge via a material in contact with the plurality of pillars.

15. The method of claim 14, wherein performing the access operation is based at least in part on biasing a second access line with a second voltage, wherein the memory cell is coupled with the second access line.

16. The method of claim 14, wherein the material in contact with the plurality of pillars is an oxide material.

17. The method of claim 14, wherein one or more pillars comprises the first pillar.

18. A method, comprising:

forming a conductive pillar along a first direction away from a substrate of a memory die, the conductive pillar configured for coupling with a first access line extending along a second direction over the substrate of the memory die;

forming a memory cell coupled between the conductive pillar and a second access line; and depositing a first material in contact with the conductive pillar opposite the first access line along the first direction, the first material configured for dissipating a voltage difference between the conductive pillar and a voltage source.

19. The method of claim 18, further comprising:

depositing a second material adjacent to the first material opposite the conductive pillar along the first direction.

20. The method of claim 19, wherein the first material comprises an oxide material and the second material comprises a conductive material.

* * * * *